United States Patent
Del Gatto

(10) Patent No.: US 7,508,717 B2
(45) Date of Patent: Mar. 24, 2009

(54) READING CIRCUIT FOR SEMICONDUCTOR MEMORY

(76) Inventor: Nicola Del Gatto, Via Asiago, 101, I-20128, Milano (IT)

( * ) Notice: Subject to any disclaimer, the term of this patent is extended or adjusted under 35 U.S.C. 154(b) by 138 days.

(21) Appl. No.: 11/740,941

(22) Filed: Apr. 27, 2007

(65) Prior Publication Data
US 2007/0258301 A1    Nov. 8, 2007

(30) Foreign Application Priority Data
May 5, 2006    (IT)    ............... MI2006A0880

(51) Int. Cl.
*G11C 11/34*    (2006.01)
(52) U.S. Cl. .................... 365/185.21; 365/185.2
(58) Field of Classification Search ............ 365/185.21, 365/185.2, 18.23
See application file for complete search history.

(56) References Cited

U.S. PATENT DOCUMENTS

| | | | |
|---|---|---|---|
| 6,021,068 A * | 2/2000 | Miki et al. ............ | 365/185.21 |
| 6,535,424 B2 * | 3/2003 | Le et al. ............... | 365/185.18 |
| 6,711,080 B2 * | 3/2004 | Kern et al. ............ | 365/189.15 |
| 7,280,405 B2 * | 10/2007 | Sarig .................... | 365/185.21 |

* cited by examiner

*Primary Examiner*—Anh Phung
(74) *Attorney, Agent, or Firm*—Blakely, Sokoloff, Taylor & Zafman LLP

(57) ABSTRACT

A reading circuit for reading semiconductor memory cells, adapted to be coupled to at least one memory cell and to at least one reference cell through a respective bit line, the reading circuit including: a pre-charge circuit for pre-charging the bit lines to a predefined voltage during a pre-charge phase of a reading operation on the memory cell; a biasing circuit for applying a bias to a respective control terminal of the memory cell and of the reference cell in response to an enabling signal; and for each bit line, an evaluation circuit for evaluating an electric quantity developing on the bit line as a consequence of the bias during an evaluation phase of the reading operation on the memory cell, an information content of the memory cell being determined on the basis of the electric quantity that develops on the bit lines. The enabling signal is provided by the pre-charge circuit in response to an indication that the bit lines have reached the predefined voltage.

13 Claims, 7 Drawing Sheets

READING CIRCUIT FOR SEMICONDUCTOR MEMORY

BACKGROUND OF THE INVENTION

1. Field of the Invention

The present invention relates to a circuit for reading memory cells, in particular for reading memory cells of semiconductor memory devices, such as non-volatile memories.

2. Discussion of the Related Art

Memory devices are commonly used to store information (either temporarily or permanently) in a number of applications. In a non-volatile memory device the information is stored permanently, in the sense that the information is preserved even when a power supply is off.

Typically, a non-volatile memory device includes a matrix of memory cells, each one used for storing bits of information. For example, in a flash memory, integrated in a chip of semiconductor material, each memory cell consists of a floating-gate MOS transistor, programmed to different levels by modifying a threshold voltage thereof, which is associated with a corresponding logic value.

The ever increasing request for high density memory sizes and the industrial need of a reduction of the cost for storage bit have led to develop techniques in which a single memory cell is adapted to store more than one bit; such memory cells are then referred to as multilevel, as opposed to two-levels memory cells that are adapted to store a single bit.

In a so-called NOR architecture of the memory matrix, each column of memory cells is coupled to a respective bit line, and each row is coupled to a respective word line. During a reading operation, the word line of an addressed memory cell is properly biased, and a current sunk by the memory cell (cell current) flows through the corresponding bit line. The cell current depends on the memory cell threshold voltage, i.e. on the memory cell's programming level.

A bank of sense amplifiers of the memory device receives the cell current, and the logic value stored in the memory cell is evaluated by comparing the cell current with at least one reference current.

Typically, the reference current is generated using a reference cell, a device structurally identical to the memory cell being read, programmed at a reference level. For example, in the case of a memory cell storing one bit, if the cell current is greater than the reference current, then the memory cell is determined to store a high logic value ('1'), otherwise it is determined to store a low logic value ('0'). Differently, for discriminating the logic value stored in a multilevel memory cell, a plurality of reference cells is provided, each one programmed at a respective reference level, for providing a plurality of different reference currents (for example, three reference cells are used, generating three reference currents, necessary for reading a four-level memory cell storing two bits of information).

A known memory cell reading technique, hereinafter shortly referred to as "voltage ramp reading technique", exploits a biasing voltage having a monotone time pattern. In particular, the waveform of the biasing voltage consists of a ramp, which increases linearly over time with a constant slope. According to the monotone biasing voltage, the cell current and the at least one reference current start to be significant at different times, i.e. when the biasing voltage of the memory cell to be read and of the reference cell(s) reaches the respective threshold voltages. Being the logic values by convention associated with increasing values of the threshold voltage, the temporal order according to which the cell current and the reference current exceed a predefined current value, uniquely identifies the logic value stored in the memory cell. In this way, the precision of the reading operation is significantly improved, especially for multilevel memory cells, and made independent of most external factors.

Before an evaluation phase of the reading operation, a phase of pre-charge of the bit lines to a predetermined potential is required, for charging stray capacitances intrinsically associated therewith. In fact, a current flowing through the bit lines causes the charging of the associated stray capacitances, and, accordingly, a corresponding transient is required before the bit line voltages and currents reach a steady value. Thus, for avoiding an incorrect reading performed during this transient, it is necessary to guarantee that the bit line charging is completed, before performing an evaluation on the logic value stored in the memory cell accessed for reading. Regretfully, the length of this transient depends on a number of factors, such as the operating temperature, the value of a supply voltage of the memory device, and statistical variations of parameters whose values are affected by the manufacturing process.

In other words, establishing a precise duration of the pre-charge phase is difficult, because it depends on many factors; on the other hand, it is very important to ensure that the evaluation phase starts only when the pre-charge phase is really completed, and the bit-line potential has stabilized, in each condition of temperature and of supply voltage for each memory cell in the semiconductor chip. The problem is particularly critical when the voltage ramp reading technique is applied.

However, a dead time between the actual completion of the pre-charge phase and the start of the evaluation phase impacts on the memory device access time, increasing the time actually required for a reading operation: this contrasts with the demand for memory devices featuring faster and faster reading operations.

In view of the state of the art outlined in the foregoing, one of the problems that the Applicant has faced has been how to provide a circuit for reading memory cells which allows optimizing the duration of a reading operation in each condition of operating temperature, supply voltage and manufacturing process parameters.

SUMMARY OF THE INVENTION

According to an aspect of the present invention, a circuit for reading memory cells adapted to be coupled to at least one memory cell and to at least one reference cell through a respective bit line, the reading circuit including a pre-charge circuit for pre-charging the bit lines to a predefined voltage during a pre-charge phase of a reading operation on the memory cell; a biasing circuit for applying a bias to a respective control terminal of the memory cell and of the reference cell in response to an enabling signal; and for each bit line, an evaluation circuit for evaluating an electric quantity developing on the bit line as a consequence of the bias during an evaluation phase of the reading operation on the memory cell, an information content of the memory cell being determined on the basis of the electric quantity that develops on the bit lines, wherein the enabling signal is provided by the pre-charge circuit in response to an indication that the bit lines have reached the predefined voltage.

According to another aspect of the present invention, a semiconductor memory, comprising at least one memory cell and a circuit for reading an information content of the memory cell.

According to still another aspect of the present invention, a method of reading memory cells, including coupling at least one memory cell and at least one reference cell to a circuit for reading memory cells through a respective bit line; pre-charging the bit lines to a predefined voltage during a pre-charge phase of a reading operation on the memory cell; applying a bias to a control terminal of the memory cell and of the reference cell in response to an enabling signal; and evaluating an electric quantity developing on each bit line as a consequence of the bias during an evaluation phase of the reading operation on the memory cell, an information content of the memory cell being determined on the basis of the electric quantity that develops on the bit lines, pre-charging the bit lines includes providing the enabling signal in response to an indication that the bit lines have reached the predefined voltage.

BRIEF DESCRIPTION OF THE DRAWINGS

The features and the advantages of the present invention will be made apparent by the following description of preferred embodiments thereof, provided merely by way of non-limitative example, description that will be conducted making reference to the attached figures, in which.

DETAILED DESCRIPTION

Figure 1:
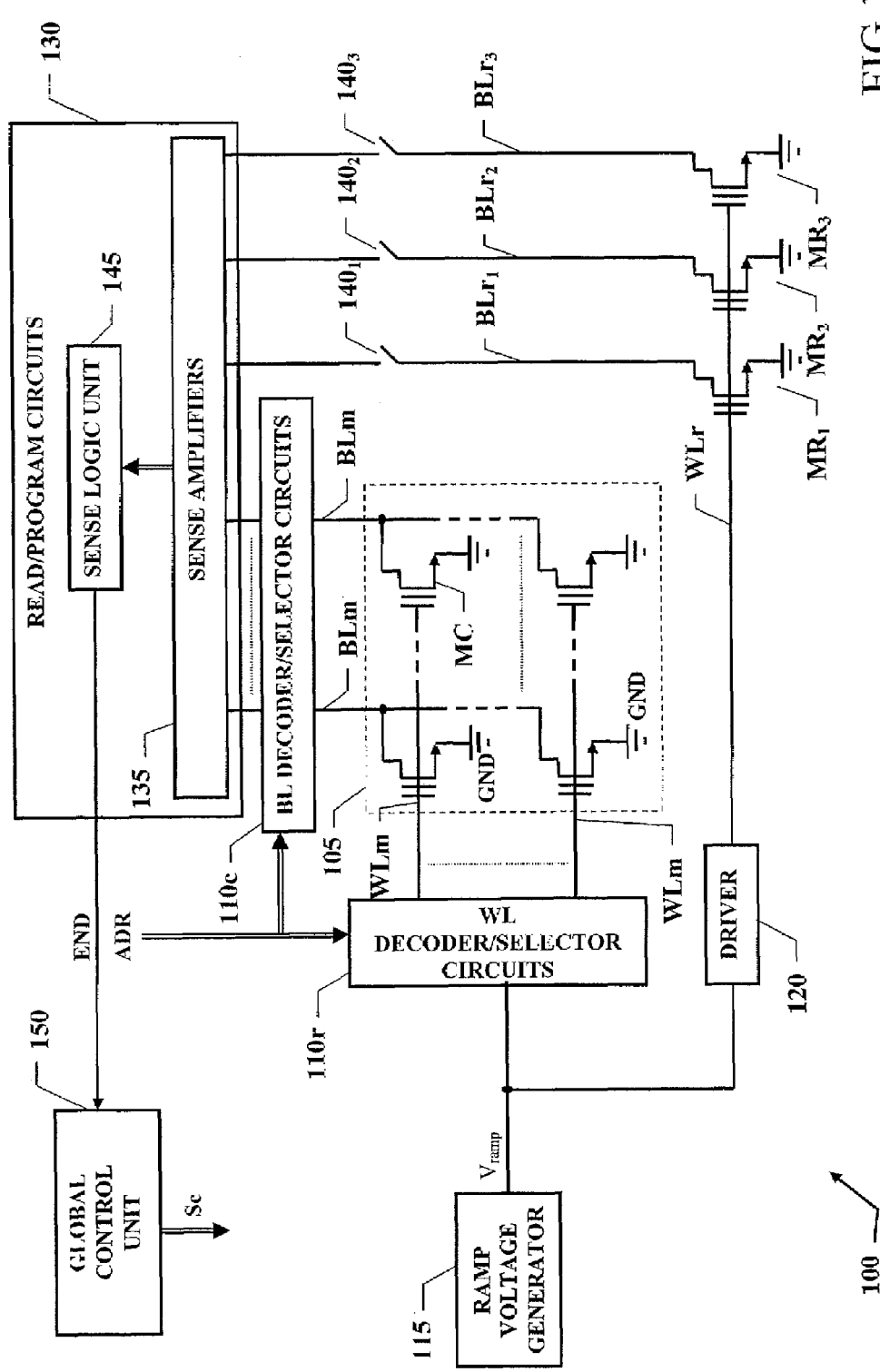
FIG. 1 schematically shows a flash memory, in terms of the functional blocks relevant to the understanding of the invention embodiments to be described.

With reference to the drawings, in particular to FIG. 1, a non-volatile memory device 100, for example comprising a flash E$^2$PROM, is illustrated. The memory device 100 is integrated in a chip of semiconductor material and includes a matrix 105 of memory cells MC.

Each memory cell MC comprises a floating-gate MOS transistor, with a programmable threshold voltage Vthc. The generic memory cell MC in a non-programmed (or erased) condition exhibits a relatively low threshold voltage. The memory cell MC is programmed by injecting electric charge into its floating gate, in such a way to increase the threshold voltage thereof.

In an exemplary but non-limitative embodiment of the present invention, the generic memory cell MC can be programmed to multiple levels, each one corresponding to a respective range of values of the threshold voltage Vthc, each range of values being associated with a different logic value. In particular, a four-level memory cell MC is adapted to store a logic value comprising 2 bits of information, i.e. 11, 10, 01 and 00, by convention associated with increasing values of the memory cell threshold voltage Vthc, as it will be described in greater detail in the following.

In the considered example, the matrix 105 has a so-called NOR architecture, in which drain terminals of the memory cells MC of each matrix column are connected to a corresponding bit line BLm, control gate terminals of the memory cells MC of each matrix row are connected to a corresponding word line WLm, and source terminals of all the memory cells MC of the matrix (or of a sector thereof are connected to a common terminal GND providing a reference supply voltage (or ground) (in alternative embodiments, the source terminals of the memory cells of the matrix, or of a sector thereof, may be connected to a common source line, whose potential may be switched between ground and, e.g., a negative value with respect to the ground).

The memory device 100 includes a plurality of reference cells; only three reference cells $MR_1$, $MR_2$ and $MR_3$ are shown in the drawing, for simplicity of illustration. The three reference cells $MR_1$, $MR_2$ and $MR_3$ are exploited for discriminating the logic values stored in the generic four-level memory cell MC. For this purpose, the threshold voltages of the reference cells $MR_1$, $MR_2$ and $MR_3$, respectively, are set to predefined values, intermediate to the threshold voltage levels that correspond to the logic values 11 and 10, 10 and 01, 01 and 00, respectively.

Likewise, drain terminals of the reference cells $MR_1$, $MR_2$ and $MR_3$ are connected to reference bit lines $BLr_1$, $BLr_2$ and $BLr_3$, respectively. Control gate terminals of the reference cells $MR_1$, $MR_2$ and $MR_3$ are for example connected to a common reference word line WLr, and source terminals thereof are connected to the ground terminal GND (in alternative embodiments of the invention, each reference cell may be connected to a respective reference word line).

The memory device 100 is adapted to manage in parallel groups of bits, which define a so-called "memory word" stored in a corresponding memory location; for example, a memory word may comprise 16 bits, stored in a memory location made up of 8 four-level memory cells MC (16 bits divided by 2 bits for each memory cell MC, in the considered example). Each memory location is, for example, associated with a single word line WLm, and with 8 bit lines BLm.

The memory device 100 receives address codes ADR, adapted to specify corresponding memory locations to be accessed. A portion of the address code ADR is provided to word line decoder/selector circuits 110r, which selects the desired word line WLm corresponding to the received address ADR. Another portion of the address code ADR is provided to bit line decoder/selector circuits 110c, which selects the bit lines BLm corresponding to the received address ADR.

The memory device 100 further includes a ramp voltage generator 115, generating a word line biasing voltage $V_{ramp}$, having for example a ramp-like pattern, e.g. with values increasing linearly over time with a constant slope; more generally, the ramp voltage generator 115 is adapted to generate a monotonically increasing or decreasing voltage. The word line decoder/selector circuits 110r and a driver 120 for the reference word line receive the word line biasing voltage $V_{ramp}$ through a biasing voltage supply line $V_{ramp}$.

During a reading operation of the memory cells MC, the word line decoder/selector circuits 110r couple the selected word line WLm (determined by the particular value of the address code ADR) with the biasing voltage supply line $V_{ramp}$, so as to bias the control gates of the corresponding memory cells MC at the biasing voltage $V_{ramp}$. Likewise, the driver 120 couples the reference word line WLr with the biasing voltage supply line $V_{ramp}$, so as to bias the control gates of the reference cells $MR_1$, $MR_2$ and $MR_3$ at the biasing voltage $V_{ramp}$.

Also, during a reading operation of the memory cells MC, the bit line decoder/selector circuits 110c connect the selected bit lines BLm (determined by the particular value of the address code ADR) to read/program circuits 130 of the memory device 100. In particular, the read/program circuits 130 comprise a bank of sense amplifiers 135 (for example, 64 sense amplifiers), which are coupled to the selected bit lines BLm during the reading operation. The sense amplifiers 135 are used for reading the logic values stored in the memory cells MC of a subset of memory locations (for example, 8 locations), a so-called "memory page". The sense amplifiers 135 are also coupled to the reference bit lines $BLr_1$, $BLr_2$ and $BLr_3$ through switches $140_1$, $140_2$ and $140_3$, respectively. As described in greater detail in the following, the sense amplifiers 135 receive current(s) sunk by the selected memory cell(s) MC and the reference cells $MR_1$, $MR_2$ and $MR_3$ through the selected bit line(s) BLm and the reference bit lines $BLr_1$, $BLr_2$ and $BLr_3$, and are adapted to detect instants in which the current(s) flowing through the selected bit line(s) BLm, and the reference bit lines $BLr_1$, $BLr_2$ and $BLr_3$ exceed a predefined value.

A sense logic unit 145, included in the read/program circuits 130, is adapted to discriminate the logic value stored in the selected memory cell MC, for example based on a temporal relation of the detected instants.

The memory device 100 also comprises a global control unit 150, adapted to generate control signals, indicated Sc as a whole, for managing the operation of the memory device 100, particularly for establishing a start time of the reading operation, more particularly a start time of the biasing voltage ramp $V_{ramp}$, and for enabling the sense amplifiers 135. The sense logic unit 145 in turn provides a logic signal END, indicative of the end of the evaluation operation of the sense amplifiers 135, to the global control unit 150.

Figure 2:
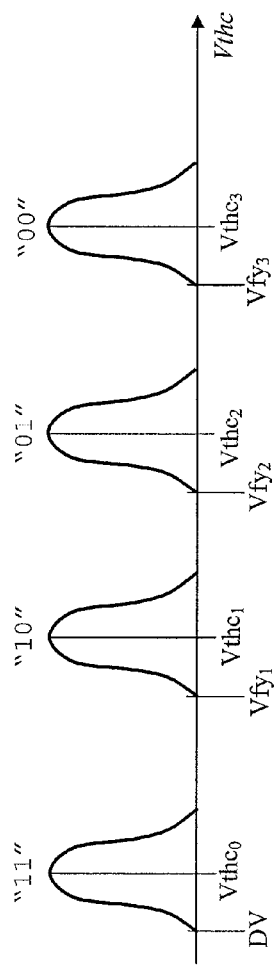
FIG. 2 schematically shows a statistical distribution of the threshold voltages of four-level memory cells and reference cells of the memory device of FIG. 1.

Referring to FIG. 2, exemplary statistical distributions of the threshold voltages Vthc of a population of memory cells, corresponding for example to the memory cells MC making up the whole matrix 105 are schematically shown. Each distribution is approximately centered around a respective threshold voltage value $Vthc_0$, $Vthc_1$, $Vthc_2$, $Vthc_3$, corresponding to a respective logic value "11", "10", "01", "00" stored in the memory cells; the threshold voltage values are represented on an axis Vthc.

In particular, the erased memory cells MC, storing by convention the logic value "11", exhibit a relatively low threshold voltage, falling in a first voltage range approximately centered around the threshold voltage value $Vthc_0$, for example of approximately 2.75 V. The memory cells MC storing the logic value "10" exhibit a threshold voltage falling in a second voltage range, approximately centered around the threshold voltage value $Vthc_1$, for example of approximately 4.15 V, higher than the threshold voltage value $Vthc_0$, but lower than a threshold voltage value $Vthc_2$, for example of approximately 5.15 V, around which a third voltage range is approximately centered, wherein a threshold voltage of memory cells MC storing the logic value "01" falls. The memory cells MC storing the logic value "00" exhibit a threshold voltage falling in a fourth voltage range approximately centered around the threshold voltage value $Vthc_3$, for example of approximately 6.35 V, higher than the threshold voltage values $Vthc_0$, $Vthc_1$ and $Vthc_2$.

Program-verify voltages, used for ascertaining that a generic memory cell is programmed at the desired level during a programming operation, correspond for example to the left extremes $Vfy_1$, $Vfy_2$ and $Vfy_3$ of the second, third and fourth voltage ranges, respectively. For example, the program-verify voltages $Vfy_1$, $Vfy_2$ and $Vfy_3$ take values of approximately 4 V, 5 V and 6.1 V. A depletion-verify voltage, used during an erasing operation for ascertaining that the memory cells threshold voltage does not become too low, corresponds to the left extreme DV of the first voltage range; for example, the depletion-verify voltage DV takes a value of 2.5 V.

The threshold voltages of the reference cells $MR_1$, $MR_2$ and $MR_3$, respectively, take values intermediate between two respective adjacent voltage ranges. Particularly, the threshold voltage of the reference cell $MR_1$ takes a value intermediate between the first voltage range (associated with the logic value "11") and the second voltage range (associated with the logic value "10"), the threshold voltage of the reference cell $MR_2$ takes a value intermediate between the second voltage range and the third voltage range (associated with the logic value "01"), the threshold voltage of the reference cell $MR_3$ takes a value intermediate between the third voltage range and the fourth voltage range (associated with the logic value "00").

Figure 3A:
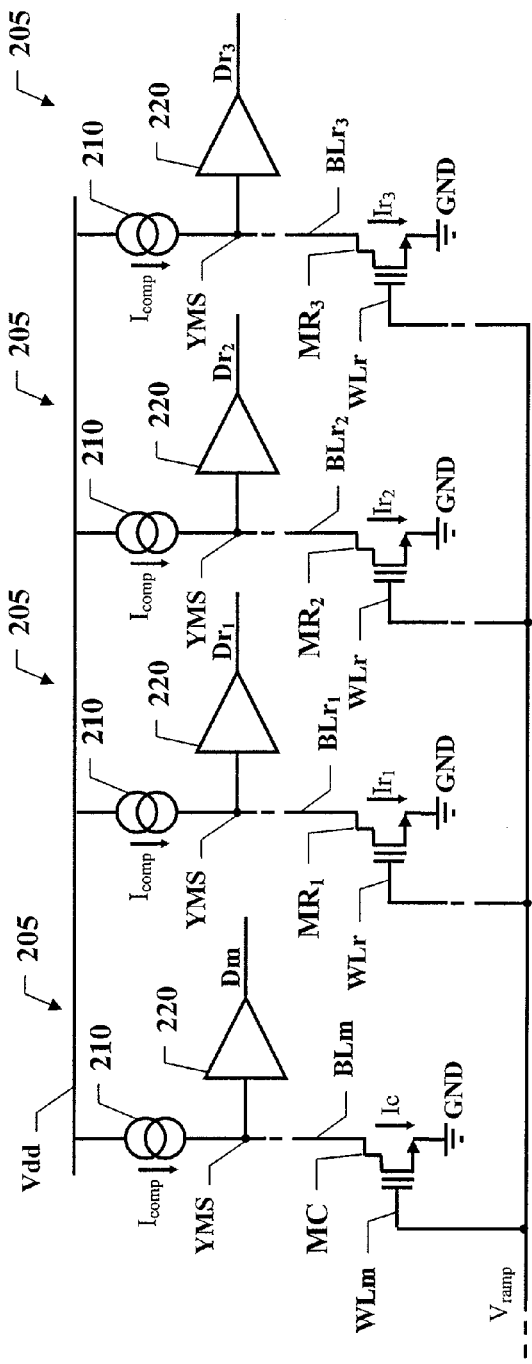
FIG. 3A schematically illustrates sense amplifiers coupled to a memory cell and to reference cells included in read/program circuits of the memory device of FIG. 1.

Considering now FIG. 3A, the architecture of sense amplifiers 205 is schematically illustrated. In particular, in FIG. 3A one generic memory cell MC and the three reference cells $MR_1$, $MR_2$ and $MR_3$ are shown, coupled to a respective sense amplifier 205 through the respective bit line BLm and the reference bit lines $BLr_1$, $BLr_2$ and $BLr_3$; for simplicity of illustration, the bit line decoder/selector circuits are not shown.

Each sense amplifier 205 comprises a current generator 210 adapted to supply a comparison current $I_{comp}$. Each current generator 210 is connected between a voltage supply line, for example the supply voltage Vdd of the memory device, and a respective circuit node YMS coupled to the respective bit line BLm, $BLr_1$, $BLr_2$, $BLr_3$.

During a reading operation of the memory cell MC, the word line WLm and the reference word line WLr are biased at the biasing voltage $V_{ramp}$. Accordingly, the memory cell MC sinks a current (cell current) Ic that depends on the word line biasing voltage $V_{ramp}$ and on its programming level, i.e. on the logic value stored therein; similarly, the reference cells $MR_1$, $MR_2$ and $MR_3$ sink a respective current (reference current) $Ir_1$, $Ir_2$, $Ir_3$ that depends the word line biasing voltage $V_{ramp}$ and on the respective reference program level.

Each node YMS is further coupled to a respective comparison circuit 220 adapted to detect when the value of the cell current Ic or, respectively, of the reference current $Ir_1$, $Ir_2$ and $Ir_3$ exceeds the value of the comparison current $I_{comp}$. The generic comparison circuit 220 provides a respective logic signal Dm, Dr1, Dr2, Dr3, which is asserted when the value of the cell current Ic, or of the reference current $Ir_1$, $Ir_2$ or $Ir_3$, exceeds the value of the comparison current $I_{comp}$.

Figure 3B:
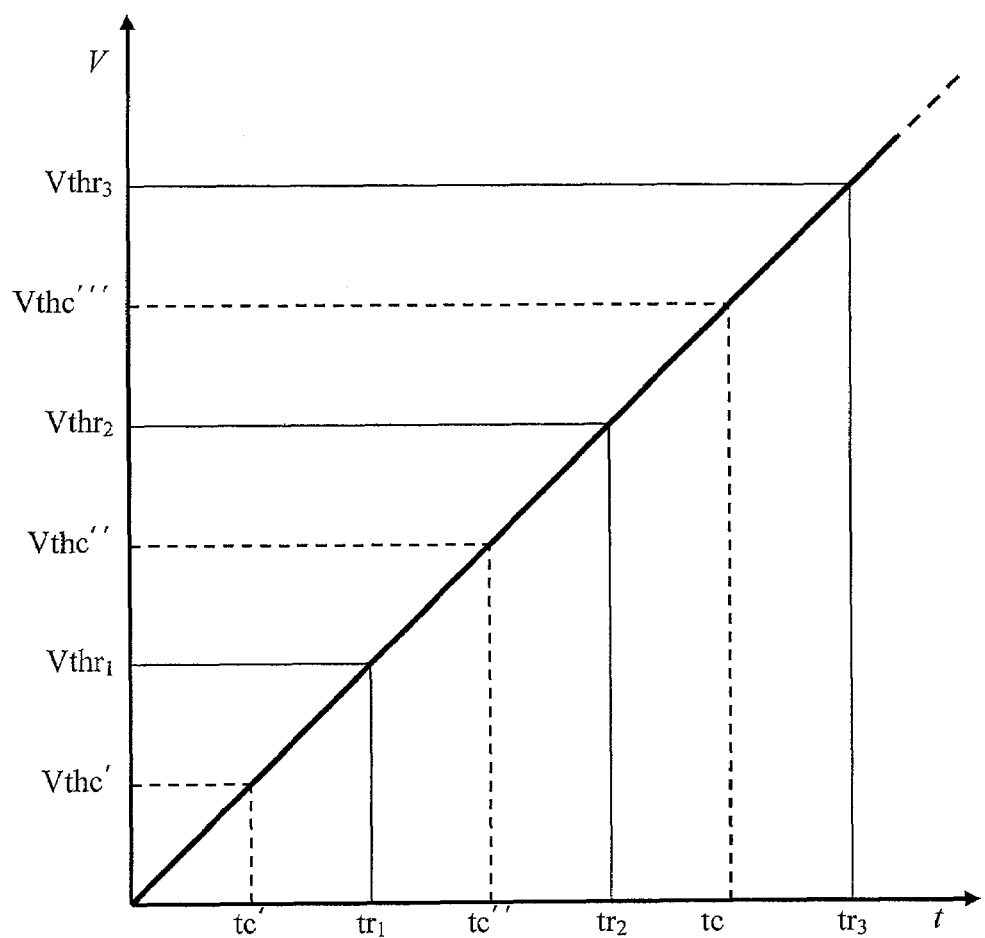
FIG. 3B is an illustrative time diagram describing the operation of the sense amplifiers illustrated in FIG. 2.

In FIG. 3B the biasing voltage $V_{ramp}$ is shown as increasing over time t with a constant slope from a start value of 0 V to a maximum value higher than the voltage at which the reference cell $MR_3$ sinks a current exceeding the comparison current $I_{comp}$.

A reading operation of the memory cell MC is described hereinafter referring jointly to FIG. 2, FIG. 3A and FIG. 3B.

When, at an instant $tr_1$, the biasing voltage $V_{ramp}$ reaches a value, denoted $Vthr_1$, such that the reference current $Ir_1$ sunk by the reference cell $MR_1$ reaches and exceeds the comparison current $I_{comp}$, the comparison circuit 220 switches. Accordingly, at the instant $tr_1$ the logic signal Dr1, provided by the comparison circuit 220 coupled to the bit line $BLr_1$, is asserted. The other logic signals Dr2 and Dr3, provided by the comparison circuits 220 coupled to the bit lines $BLr_2$ and $BLr_2$, are similarly asserted in succession at respective instants $tr_2$ and $tr_3$, after the biasing voltage $V_{ramp}$ reaches (at the instants $tr_2$ and $tr_3$) voltage values $Vthr_2$ and $Vthr_3$, respectively.

Likewise, the logic signal Dm, provided by the comparison circuit 220 coupled to the bit line BLm, is asserted when the biasing voltage $V_{ramp}$ reaches (at an instant tc', tc" or tc''', depending on the programming level of the memory cell) a value Vthc', Vthc", Vthc''' such that the current sunk by the memory cell MC exceeds the comparison current $I_{comp}$.

As a result, the temporal relationship between the instants at which the logic signals Dr1, Dr2, Dr3 and Dm switches (e.g. are asserted) uniquely identifies the logical value stored in the memory cell MC being read.

For example, assuming that the memory cell MC has a threshold voltage within the distribution centered around $Vthc_0$, the word line biasing voltage $V_{ramp}$ will reach the value Vthc' at an instant tc' that precedes the instant $tr_1$, then all the logic signals Dr1, Dr2 and Dr3 are still deasserted when the signal Dm is asserted. This indicates that the memory cell's threshold voltage is lower than the threshold voltage of the reference cell Mr1, and thus the memory cell MC stores the logic value "11". In case the memory cell MC has a threshold voltage within the distribution centered around $Vthc_1$, the word line biasing voltage $V_{ramp}$ will reach the value Vthc" at an instant tc" comprised between the instants $tr_1$ and $tr_2$, when the logic signal Dr1 is asserted but the logic signals Dr2 and Dr3 are still deasserted; this indicates that the memory cell MC stores the logic value "10". In case the memory cell MC has a threshold voltage within the distribution centered around $Vthc_2$, the word line biasing voltage $V_{ramp}$ will reach the value Vthc''' at an instant tc''' comprised between the instants $tr_2$ and $tr_3$, when the logic signals Dr1 and Dr2 are asserted but the logic signal Dr3 is still deasserted; this indicates that the memory cell MC stores the logic value "01". In case the memory cell MC has a threshold voltage within the distribution centered around $Vthr_3$, then the signal Dm will still be deasserted when, at the instant $tr_3$, the logic signals Dr1, Dr2 and Dr3 are all asserted; this indicates that the memory cell MC stores the logical value "00".

When the logic signal Dr3 is asserted at the instant $tr_3$, the sense logic unit 145 provides to the global control unit the corresponding logic signal indicative of the end of the reading operation.

Figure 4A:
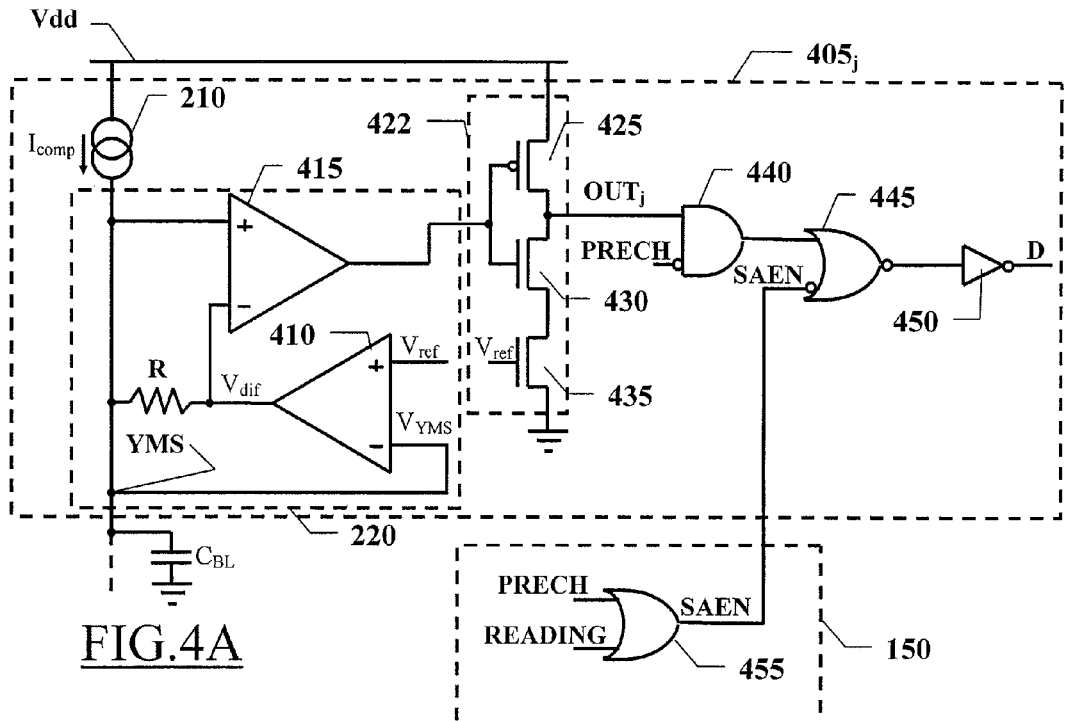
FIG. 4A illustrates in greater detail a sense amplifier of the memory device of FIG. 1.

Considering now FIG. 4A, a sense amplifier $405_j$ (where j is an index taking an integer value between 1 and N, N being the number of the sense amplifiers, including the sense amplifiers for the reference cells) is represented in greater detail. The elements corresponding to those depicted in FIGS. 1 and 3A are denoted with the same reference numerals, and their description is omitted for the sake of simplicity.

The comparison circuit 220 of the sense amplifier $405_j$ includes a first and a second differential amplifiers 410, 415.

The first differential amplifier 410 has a non-inverting input terminal (+) receiving a suitable reference voltage Vref, for example, provided by a voltage generator, like for example a band-gap reference voltage generator (not shown in the drawing). An inverting input terminal (−) of the first differential amplifier 410 is connected to the node YMS. An output terminal of the first differential amplifier 410 is connected to a first terminal of a resistor R, a second terminal of the resistor R being connected to the node YMS.

The second differential amplifier 415 has a non-inverting input terminal (+) connected to the node YMS and an inverting input terminal (−) connected to the first terminal of the resistor R and to the output terminal of the first differential amplifier 410.

The comparison circuit 220 further includes an inverter 422 consisting of a p-MOS transistor 425 and two n-MOS transistors 430, 435. Source terminals of the p-MOS and n-MOS transistors 425 and 435 are connected to the voltage supply line Vdd and to the ground terminal GND, respectively. Drain terminals of the p-MOS and n-MOS transistors 425 and 430 are connected together to form an output terminal of the inverter 422, supplying a logic signal $OUT_j$. A drain terminal of the n-MOS transistors 435 is connected to a source terminal of the n-MOS transistor 430.

Gate terminals of the p-MOS and n-MOS transistors 425 and 430 are connected together to form an input terminal of the inverter 422; an output terminal of the second differential amplifier 415 is connected to the input terminal of the inverter 422. A gate terminal of the n-MOS transistors 435 receives the reference voltage Vref.

The comparison circuit 405 comprises an AND gate 440, a NOR gate 445 and a NOT gate 450. These logic gates 440, 445 and 450 process logic signals PRECH and SAEN, supplied by the global control logic, together with the logic signal $OUT_j$.

The AND gate 440 has a first input terminal connected to the output terminal of the inverter 422 for receiving the logic signal $OUT_j$ and a second input terminal receiving an inverted version of the logic signal PRECH.

The NOR gate 445 has a first input terminal connected to an output terminal of the AND gate 440 and a second input terminal receiving an inverted version of the logic signal SAEN.

The NOT gate 450 has an input terminal connected to an output terminal of the NOR gate 445 and an output terminal providing a logic signal D, corresponding to one the logic signals Dm, Dr1, Dr2 and Dr3 described above.

The logic signal SAEN is provided at an output terminal of an OR gate 455 of the global control unit 150. The OR gate 455 receives the logic signal PRECH at a first input terminal and a logic signal READING at a second input terminal, the logic signals PRECH and READING being generated by the global control unit 150.

Figure 4B:
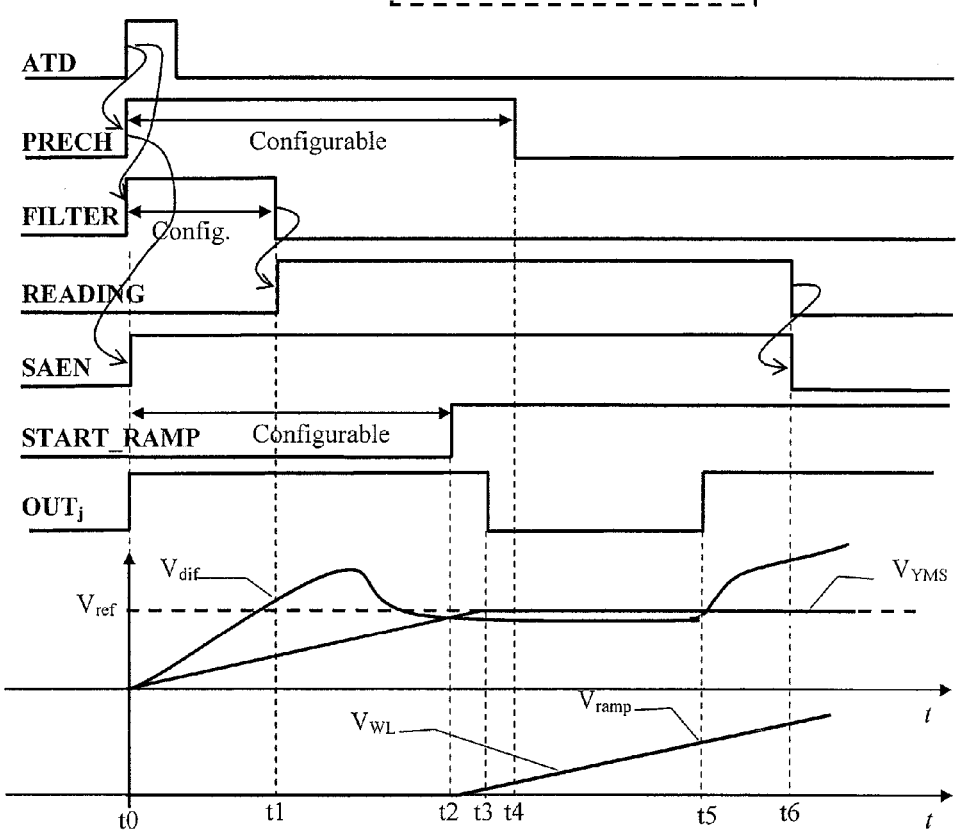
FIG. 4B is a diagram showing, in simplified way, the timing of some signals involved in the sense amplifier of FIG. 4A, during a reading operation.

In FIG. 4B a diagram shows, in simplified way, the timing of the logic signals involved in the sense amplifier of FIG. 4A during a reading operation. The operation of the sense amplifier 405 will be now described making reference to FIG. 4B in conjunction with FIG. 1 and FIG. 4A.

Let it be assumed that, at a generic instant t0, an address code ADR is received by the memory device 100, identifying a memory location of memory cells MC. The received address code ADR is detected by (an address transition detection circuit of) the global control unit 150, which in response generates a corresponding signal pulse ATD referred to as Address Transition Detection (or ATD). After decoding the received address code, the bit line decoder/selector circuits 110c select the corresponding bit lines BLm, $BLr_1$, $BLr_2$ and $BLr_3$, electrically connecting them to the sense amplifiers 405.

At the instant t0 the global control unit 150 asserts the logic signals PRECH and FILTER. The logic signal FILTER has a length sufficient to ensure that the (stray capacitances associated with the) word lines WLm and WLr are completely discharged to ground before starting to apply the biasing voltage $V_{ramp}$, also in the case in which a reading operation starts after an interruption of a preceding reading operation. The assertion of the logic signal PRECH causes the assertion of the logic signal SAEN, which enables the sense amplifier 405 by unblocking the NOR gate 445, however, the AND gate 440 is blocked.

The assertion of the signal PRECH starts the pre-charge phase of the reading operation.

The pre-charge phase is required because of stray capacitances $C_{BL}$ intrinsically associated with the bit lines BLm, $BLr_1$, $BLr_2$, and $BLr_3$. In fact, a current flowing through the bit lines BLm, $BLr_1$, $BLr_2$, and $BLr_3$ causes the charging of the stray capacitances $C_{BL}$; accordingly, until the stray capacitances are charged, the bit line voltages are not stable, and a corresponding transient is observed before the bit line voltages and currents reach a steady value. Then, for avoiding a wrong reading during this transient, it is necessary to wait for a stabilization of the bit line voltage to the predefined potential Vref, before performing an evaluation of the logic value stored in the memory cell MC.

During the pre-charge phase the word lines WLm and WLr are kept at a voltage $V_{WL}$ equal to 0 V and, accordingly, the memory cells MC are kept turned off.

The current necessary for bringing a voltage $V_{YMS}$ at the node YMS to the reference voltage $V_{ref}$ is provided by the differential amplifier 410 and by the current generator 210. In particular, the voltage $V_{YMS}$ at the node YMS is initially (i.e., when the bit line stray capacitance is not charged) lower than the target voltage $V_{ref}$ (as shown in FIG. 4B); the differential amplifier 410 delivers a current through the resistor R, and this current contributes, together with the current delivered by the current generator 210, to the charging of the bit line stray capacitance $C_{BL}$. The current delivered by the differential amplifier 410 causes a voltage drop across the resistor R, and a voltage $V_{dif}$ at the output terminal of the differential amplifier 410 is initially greater than the voltage $V_{YMS}$. Particularly, at the beginning of the charging of the stray capacitance $C_{BL}$, when a value of the voltage $V_{YMS}$ is far from the voltage $V_{ref}$, the voltage $V_{dif}$ increases rather rapidly towards a value higher than the voltage $V_{ref}$. When the voltage $V_{YMS}$ begins to approach the voltage $V_{ref}$, the current delivered by the amplifier 410 decreases, and thus also the voltage $V_{dif}$ decreases.

During this transient, the non-inverting input terminal of the amplifier 415 has a potential lower than that of the inverting input terminal. The differential amplifier 415 acts as a comparator, thus a voltage at the output terminal thereof is low and, accordingly, the logic signal $OUT_j$ at the output of the inverter 422 is high.

When the voltage $V_{YMS}$ reaches the voltage $V_{ref}$, the comparison current $I_{comp}$ delivered by the current generator 210 is sunk by the differential amplifier 410, because the selected memory cell MC, or the reference cell $MR_1$, $MR_2$, $MR_3$, is still not conductive, irrespective of the programming state thereof, being the word line biasing voltage still zero. The comparison current $I_{comp}$ sunk by the amplifier 410 causes a voltage drop across the resistor R, such that the voltage $V_{dif}$ becomes lower than the voltage $V_{YMS}$. The logic signal $OUT_j$ at the output of the inverter 422 switches low (at an instant t3), but this does not affect the logic state of the signal D, because the AND gate 440 is blocked.

In the meanwhile, at an instant t1 the logic signal FILTER is deasserted, and the logic signal READING is asserted. The logic signal READING enables the word line decoder/selector circuits 110r and the driver 120 to electrically couple the word lines WLm and WLr to the ramp voltage generator 115.

At an instant t2, after a predetermined time from the ATD pulse, a logic signal START_RAMP is asserted by the global control unit 150 to the ramp voltage generator 115, which in response applies the ramp voltage $V_{ramp}$ to the selected word line WLm and to the reference word line WLr.

The logic signal PRECH is deasserted at an instant t4. The deassertion of the signal PRECH causes the end of the pre-charge phase, and the start of the evaluation phase. The logic signal SAEN remains asserted, because the signal READING is still asserted; the AND gate 440 is unblocked, and enables transferring the logic state of the signal $OUT_j$ to the output D.

In particular, the deassertion of the signal PRECH may occur after the signal START-RAMP has been asserted, i.e. while the word line voltage $V_{WL}$ is already increasing according to the ramp voltage $V_{ramp}$. In this case, it has to be ensured that when the pre-charge phase ends, the ramp voltage $V_{ramp}$ has not yet reached the depletion verify voltage DV, in order to avoid possibly turning some memory cells MC storing the "11" value before the pre-charge has finished.

As the voltage $V_{WL}$ at the word line WLm approaches the threshold voltage of the selected memory cell MC (which depends on the memory cell program state), the memory cell MC starts sinking a progressively increasing current $I_{MC}$, which flows through the bit line BLm. A progressively increasing fraction of the comparison current $I_{comp}$ is now absorbed by the memory cell MC, while the differential amplifier 410 continues sinking the difference between the comparison current $I_{comp}$ and the cell current $I_{MC}$ through the resistor R.

The amplifier 410 tends to keep the potential at the node YMS equal to the reference voltage $V_{ref}$, because the inverting input thereof acts as a "virtual ground" (the higher the gain of the amplifier 410, the closer the voltage of the node YMS to the voltage of the non-inverting input of the differential amplifier 410, i.e. to the reference voltage $V_{ref}$).

As long as the memory cell MC does not sink current, or the cell current $I_{MC}$ is less than the comparison current $I_{comp}$, the current sunk by the differential amplifier 410 causes a voltage drop across the resistor R. In this conditions, the inverting input terminal of the differential amplifier 415 is kept at a potential higher than that of the non-inverting input terminal, and the logic signal $OUT_j$ is therefore deasserted.

The AND gate 440 receives the logic signal $OUT_j$, i.e. a logic value '0', and, accordingly, provides a logic value '0'. The NOR gate 445 receives this logic value '0' and, accordingly, provides a logic value '1'. The NOT gate 450 inverts the logic value '1' and provides the logic signal D at '0'.

When the cell current $I_{MC}$ reaches the comparison current $I_{comp}$, the current flowing through the resistor R becomes zero, but the regulation of the voltage $V_{YMS}$ at the node YMS is still guaranteed.

When the cell current $I_{MC}$ sunk by the memory cell MC exceeds the comparison current $I_{comp}$, the amplifier 410 starts delivering a difference current, flowing through the resistor R, which causes an opposite voltage drop thereacross, such that the differential amplifier 415 switches (instant t5) the voltage at the output terminal thereof high and, accordingly, the logic signal $OUT_j$ is asserted. The AND gate 440, receiving now the logic signal $OUT_j$ at the logic value '1', provides the logic value '1'. Accordingly, the NOR gate 445 provides the logic value '0', and the NOT gate 450 the logic signal D at '1'.

The evaluation phase ends when the reference cell $MR_3$ sinks a current greater than the comparison current $I_{comp}$. The sense logic unit 145 provides the corresponding logic signal to the global control unit 150, which deasserts the logic signal READING at an instant t6. As a consequence, also the logic signal SAEN is deasserted.

The length of the logic signal PRECH establishes a length of the phase of pre-charge of the bit lines BLm, BLr$_1$, BLr$_2$ and BLr$_3$ to the predefined potential V$_{ref}$.

The length of the pre-charge phase, i.e. the duration of the logic signal PRECH, is preferably configurable, in the phase of testing of the memory device, so as to ensure that the bit lines BLm, BLr$_1$, BLr$_2$, and BLr$_3$ reach the reference voltage potential V$_{ref}$ in each condition of temperature and of supply voltage Vdd for each memory cell MC arranged in the semiconductor chip, also in consideration of the unavoidable statistical spread of parameters due to manufacturing process variations. Similarly, also the duration of the signal FILTER and the delay of the assertion of the signal START_RAMP from the ATD pulse ATD are preferably configurable.

The Applicant has observed that a problem of the above described sense amplifier 405$_j$ resides in the dead time between a real end time of the pre-charge phase and an initial time of the evaluation phase, i.e. deassertion of the signal PRECH; the Applicant has observed that this dead time, which is wasted, impacts on the access time of the memory device, increasing the time required for a reading operation. For example, referring to FIG. 4B, the pre-charge of the bit line stray capacitance C$_{BL}$ ends at the instant t3, when the logic signal OUT$_j$ switches, from a high logic value to a low logic value. However, in order for the evaluation phase to start, the deassertion of the signal PRECH (at the instant t4) has to be waited for.

The actual time necessary for charging a generic bit line (i.e. the length of the time interval t3-t0) is not predictable, and depends on several parameters like the operating temperature, the value of the supply voltage Vdd, and on statistical variations of parameters due to manufacturing process tolerances.

Due to this variability, the duration of the signal PRECH has to be tuned on the worst case.

In the practice, the duration of the signal PRECH is made configurable on-chip, i.e. it can be varied, during the device testing. The variation is necessarily of discrete amounts (i.e., the duration of the signal PRECH may be increased of predetermined deltas. In the testing phase, the proper configuration for the length of the signal PRECH is chosen adapted to guarantee that the length of the pre-charge phase is sufficient for charging the bit lines in the worst case conditions (the length of the logic signal PRECH is configured so as to guarantee that when it is deasserted, the switching of all the logic signal OUT$_j$ has already occurred). Thus, in a real operation, when the pre-charge of the bit lines may be significantly faster, the dead time between the actual completion of the pre-charge and the start of the evaluation phase may be significant.

In addition, the dead time between the actual completion of the bit line pre-charge and the start of the evaluation phase depends also on a propagation delay of the control signal PRECH along a signal line running across the chip from the global control unit 150 to the sense amplifier 405$_j$.

In the following, a reading circuit is presented adapted to overcome the above-mentioned drawbacks.

Figure 5A:
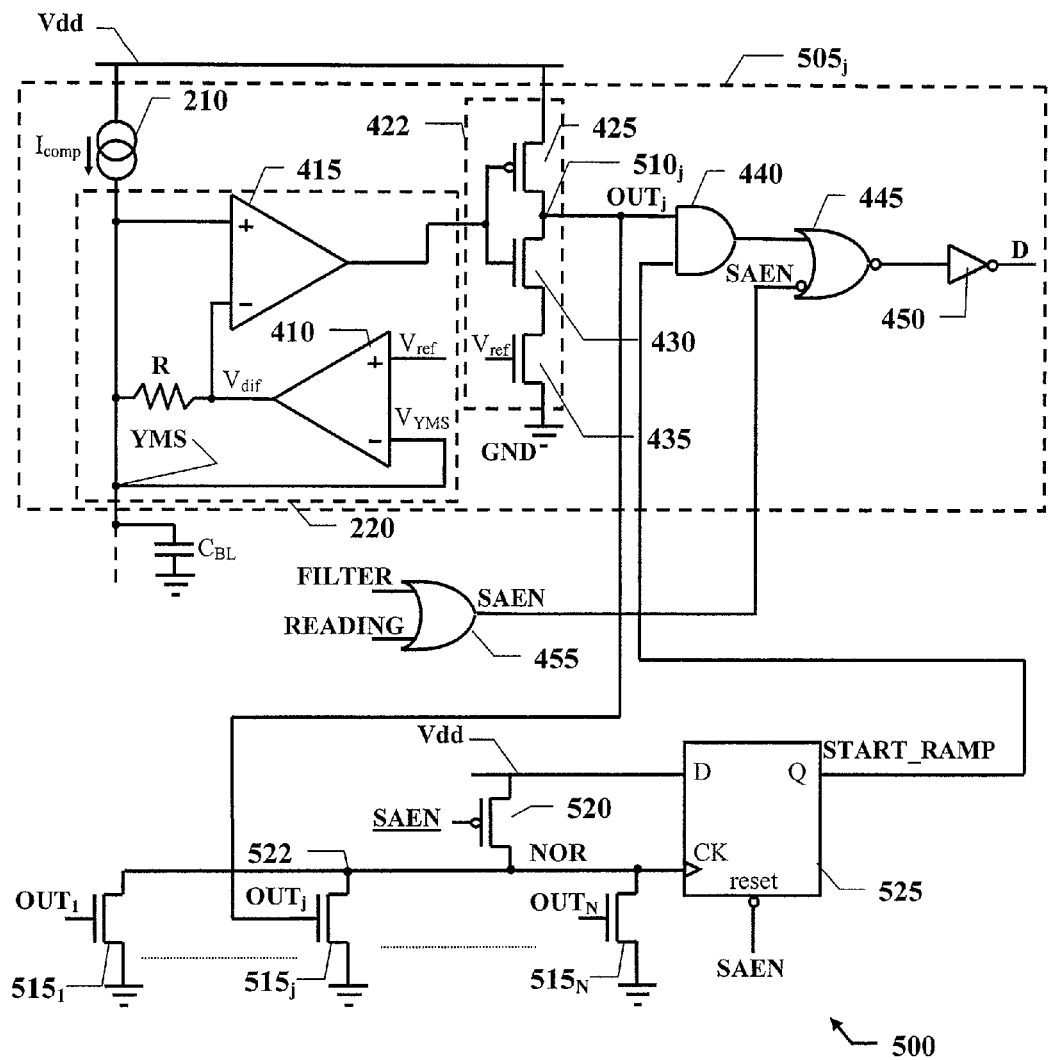
FIG. 5A illustrates a circuit for reading memory cells, according to an embodiment of the present invention.

Referring to FIG. 5A, a circuit 500 for reading memory cells MC, according to an embodiment of the present invention, is illustrated (the elements corresponding to those depicted in FIG. 4A are denoted with the same reference numerals and their description is omitted for the sake of simplicity).

The reading circuit 500 is included in the read/program circuits 130 of the memory device 100, and comprises a plurality of sense amplifiers 505$_j$, each one providing a respective logic signal OUT$_j$ at an output node 510$_j$ of the inverter 422, formed by the drain terminals of the p-MOS and n-MOS transistors 425 and 430.

The output nodes 510$_j$ of all the sense amplifiers 505$_j$ are combined together in wired-NOR configuration. In detail, the reading circuit 500 includes a plurality of n-MOS transistors 515$_j$, one for each sense amplifier 505$_j$. Each n-MOS transistor 515$_j$ has a source terminal connected to the ground terminal GND, a drain terminal connected to a common node 522, providing a logic signal NOR, and a gate terminal receiving the respective logic signal OUT$_j$.

The reading circuit 500 further includes a pull-up p-MOS transistor 520 having a source terminal connected to the voltage supply terminal Vdd, a drain terminal connected to the node 522 and a gate terminal receiving the logic complement $\overline{SAEN}$ of the logic signal SAEN.

Furthermore, the reading circuit 500 comprises a D flip-flop 525 having a data input terminal (D) connected to the voltage supply terminal Vdd, a clock input terminal (CK) connected to the node 522, a reset input terminal receiving the logic signal SAEN and an output terminal (Q) providing the logic signal START_RAMP.

The AND gate 440 receives the logic signal START_RAMP generated by the flip-flop 525 (in place of the logic signal PRECH described with reference to FIG. 4A) and the respective logic signal OUT$_j$. Alternatively, the AND gate 440 may receive a complemented version of a signal being the negated of the signal START_RAMP and taken at the complemented output terminal (Q) of the flip-flop 525.

Figure 5B:
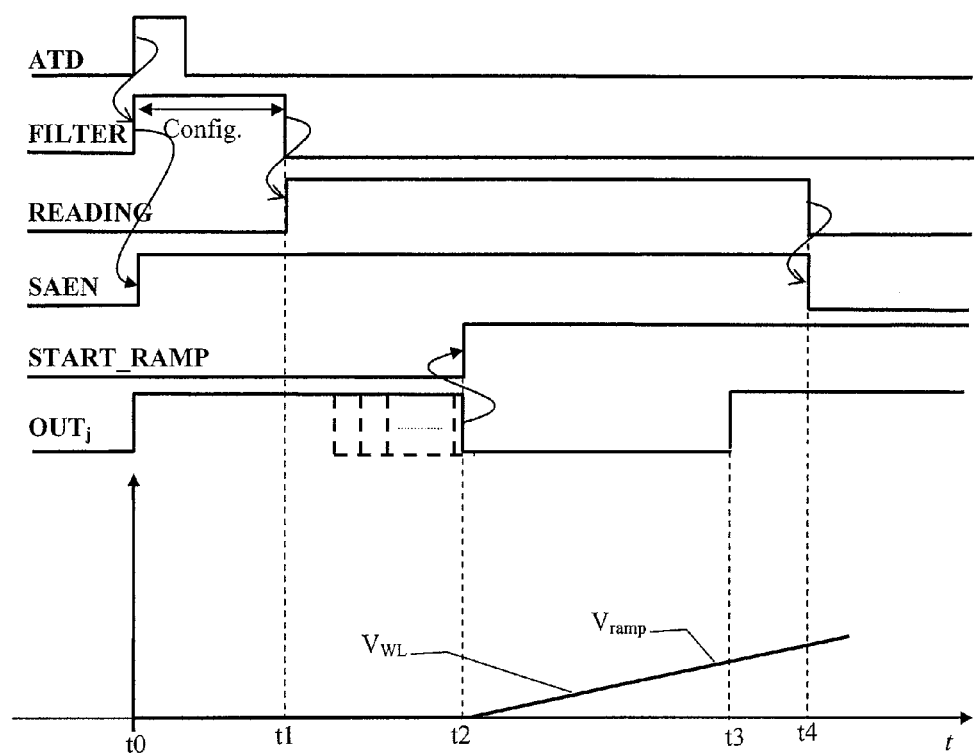
FIG. 5B is a diagram showing, in simplified way, the timing of some signals involved in the circuit for reading memory cells of FIG. 5A, during a reading operation.

In FIG. 5B a diagram shows, in simplified way, the timing of the logic signals involved in the reading circuit 500 of FIG. 5A during a reading operation. The operation of the reading circuit 500 will be now described making reference to FIG. 5B in conjunction with FIG. 1 and FIG. 5A.

Let it be assumed that, at a generic instant t0, the global control unit 150 generates an ATD signal pulse ATD. At this instant t0, the global control unit 150 asserts the logic signal FILTER and, accordingly, also the logic signal SAEN is asserted.

At an instant t1, the logic signal FILTER is deasserted, and the logic signal READING is asserted, keeping the logic signal SAEN again asserted. The duration of the signal FILTER may again be configurable, so that it is ensured that the discharge of the word lines is completed even in worst-case conditions.

In the meanwhile, the node YMS begins to be pre-charged to the reference voltage V$_{ref}$, as described above. After a time depending on the temperature, on the supply voltage Vdd, and on statistical variations of parameters due to manufacturing process tolerances, the logic signal OUT$_j$ of each sense amplifier 505$_j$ switches from a high logic value to a low logic value.

Being the logic signal SAEN asserted at the high voltage level, the gate terminal of the pull-up p-MOS transistor 520 is kept at the ground voltage, so the p-MOS transistor 520 is turned on.

The conductivities of the MOS transistors 520 and 515$_1$, . . . , 515$_N$ are such that until at least one of the logic signals OUT$_j$ is high, the logic signal NOR is kept low; as soon as all the logic signals OUT$_j$ are at the low logic value, the logic signal NOR is asserted, i.e. it is brought to the high logic value (instant t2).

The logic signal NOR acts a clock signal for the flip-flop 525, which, at the instant t2, latches the high logic value '1', by having the data input terminal connected to the voltage supply terminal Vdd.

Thus, at the instant t2, the flip-flop 525 asserts the logic signal START_RAMP and the ramp voltage generator 115 starts supplying the ramp voltage $V_{ramp}$ to the word lines WLm and WLr.

In this way, the evaluation phase is started at the instant t2. At an instant t3, when the current sunk by the memory or reference cell exceeds the comparison current $I_{comp}$, the generic logic signal $OUT_j$ switches high. As discussed in the foregoing, the data stored in the addressed memory cells are determined based on the time relationship between the instants (t3) at which the logic signals $OUT_j$ switch.

The evaluation phase finishes at an instant t4 when the current sunk by the reference cell $MR_3$ reaches and exceeds the comparison current, the sense logic unit 145 providing the corresponding logic signal and the global control unit 150 deasserting the logic signal READING.

When the logic signal SAEN is deasserted, the flip-flop 525 is reset.

It can be appreciated that, advantageously, there are no dead times between the actual completion of the pre-charge phase in respect of all the bit lines and the start of the evaluation phase, and the access time of the memory device is optimized, with a beneficial impact on the time required for a reading operation (which is reduced compared to the solution previously presented). In fact, the evaluation phase starts substantially at the instant t2, by assertion of the logic signal START_RAMP, right after the pre-charge of the stray capacitance $C_{BL}$ of all the bit lines BLm, $BLr_1$, $BLr_2$ and $BLr_3$ is completed, as signaled by the fact that all the logic signals $OUT_j$ have switched to the low logic value '0'.

Thus, there is not the necessity of a logic signal of predetermined, configurable length, like the signal PRECH in the previously presented solution, for controlling the pre-charge phase, which now has a self-defined length rather than a fixed, predetermined (albeit configurable) length. Accordingly, the present invention avoids the problem of configuring the pre-charge phase duration considering a variability depending on the temperature, on the supply voltage Vdd and on the statistical distribution of process parameters.

In addition, the present invention eliminates the need for signal lines distributing a pre-charge logic signal and a start-ramp logic signal, running across the chip from the global control unit 150 to the read/program circuits 130 and to the ramp voltage generator 115. Accordingly, also a propagation delay of the logic signals is eliminated or reduced.

Furthermore, the global control unit 150 is simplified, since the pre-charge logic signal PRECH is eliminated, and the start-ramp logic signal START_RAMP is generated locally to the read/program circuits 130.

The ramp biasing voltage $V_{ramp}$ may start from ground or from a higher voltage.

Figure 6A:
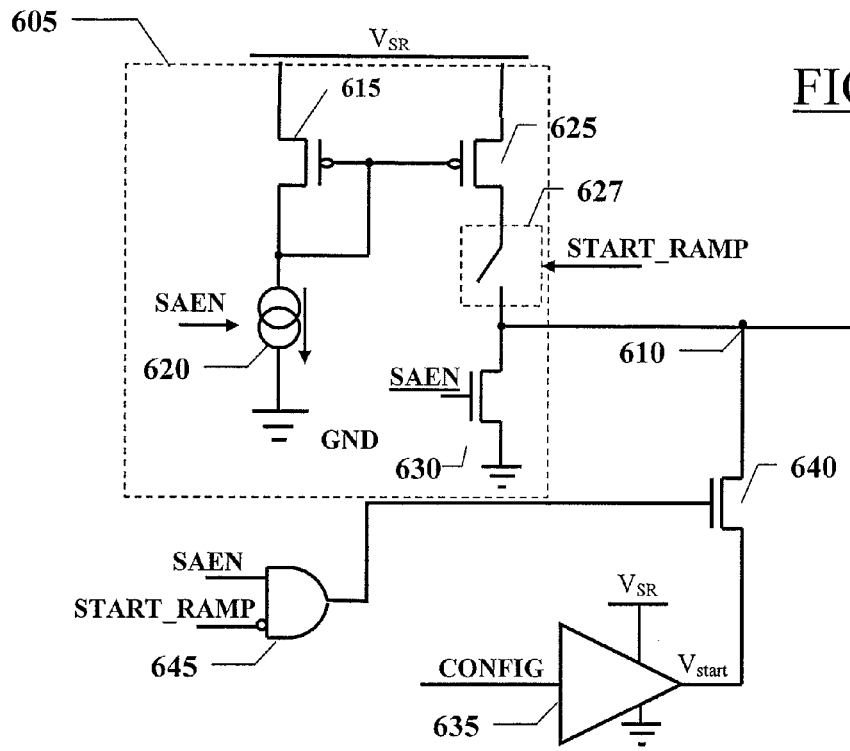
FIG. 6A shows a word line voltage supply circuit, according to a preferred embodiment of the present invention and included in a ramp voltage generator of the memory device of FIG. 1.

With reference now to FIG. 6A, a voltage supply circuit 600 is shown, according to a preferred embodiment of the present invention and included in the ramp voltage generator 115. The voltage supply circuit 600 is adapted to supply a voltage $V_{start}$, from which the ramp voltage $V_{ramp}$ starts, instead of the ground voltage (hereinafter the voltage $V_{start}$ is referred to as start ramp voltage). Particularly, the start ramp voltage $V_{start}$ is higher than the ground voltage, but lower than the depletion verify voltage DV.

The voltage supply circuit 600 includes a circuit arrangement 605 comprising a current mirror structure. The circuit arrangement 605 has a first circuit branch including a diode-connected p-MOS transistor 615, having a source terminal receiving a ramp supply voltage $V_{SR}$ (for example, 6.5 V) and, in series thereto, a current generator 620 sinking a prescribed current, having a terminal connected to the ground terminal GND; the current generator 620 is enabled by the logic signal SAEN. The p-MOS transistor 615 mirrors the current into a second branch, comprising a p-MOS transistor 625, having a source terminal receiving the ramp supply voltage $V_{SR}$ and a gate terminal connected to a gate terminal of the p-MOS transistor 615. The p-MOS transistor 625 is connected in series to a switch 627 (e.g. a pass transistor), being a drain terminal of the p-MOS transistor 625 connected to a first terminal of the switch 627. The switch 627 in turn has a second terminal connected to a drain terminal of a n-MOS transistor 630 so as to form an output node 610; the switch 627 is enabled by the logic signal START_RAMP. The n-MOS transistor 630 has a source terminal connected to the ground terminal GND and a gate terminal receiving the complemented logic signal SAEN.

The voltage supply circuit 600 further includes a voltage regulator 635 supplied with the ramp supply voltage $V_{SR}$ and configurable according to a configuration code CONFIG, provided for example by the global control unit 150. The configuration code CONFIG defines in particular the value of the start ramp voltage $V_{start}$, between ground and the depletion verify voltage DV, provided at an output terminal of the voltage regulator 635.

An n-MOS transistor 640 acts as a pass transistor between the output node 610 and the voltage regulator 635; in detail, the n-MOS transistor 640 has a first source/drain terminal connected to the output node 610 and a second source/drain terminal connected to the output terminal of the voltage regulator 635.

An AND gate 645 receives the logic signal SAEN and the inverted logic signal START_RAMP and a result of the AND logic operation, and generates a control signal that is provided to a gate terminal of the n-MOS transistor 640.

Figure 6B:
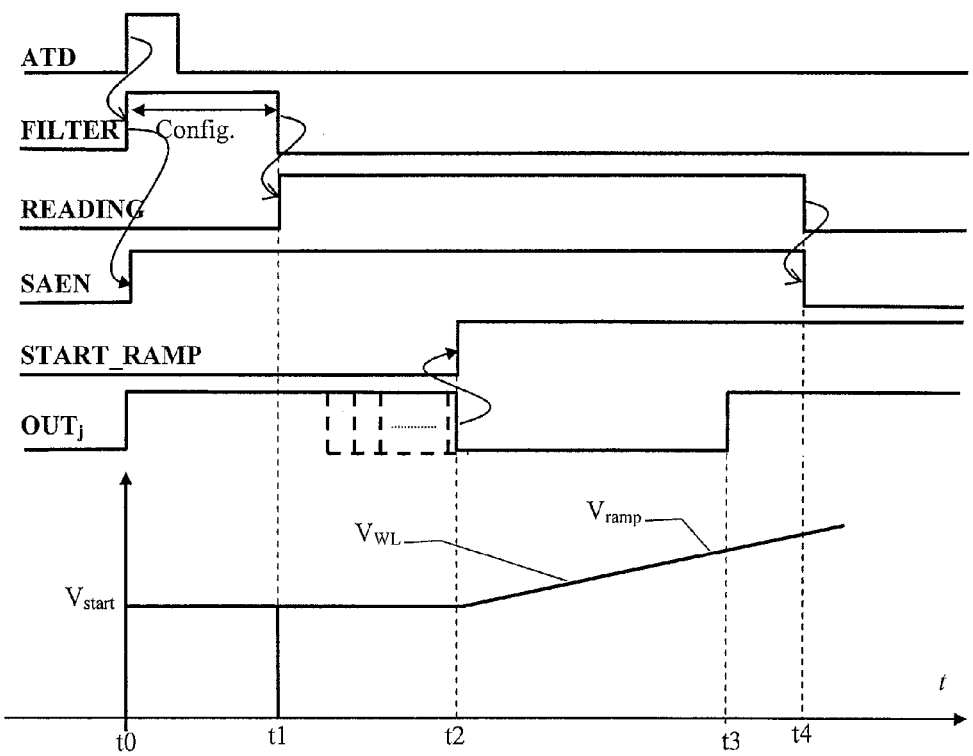
FIG. 6B is a diagram showing, in simplified way, the timing of the logic signals involved in the reading circuit of FIG. 5A, according to a preferred embodiment of the present invention.

In FIG. 6B a diagram shows, in simplified way, the timing of the logic signals involved in the reading circuit 500 of FIG. 5A and in the voltage supply circuit 600 of FIG. 6A during a reading operation, according to the preferred embodiment of the present invention. The operation of the voltage supply circuit 600 will be now described making reference to FIG. 6B in conjunction with FIG. 5A.

During a reading operation, when at the instant t0 the logic signal SAEN is asserted by the pulse ATD, the current generator 620 is enabled and generates a current, which however can not be mirrored in the p-MOS transistor 625, since the logic signal START_RAMP is still deasserted and the switch 627 is open. Being the logic signal SAEN asserted, the gate of the n-MOS transistor 630 is at the ground voltage, i.e. the n-MOS transistor 630 is turned off.

Being the logic signal SAEN asserted and the logic signal START_RAMP deasserted, the gate of the n-MOS transistor 640 is at the high logic value and the n-MOS transistor 640 turned on. Accordingly, during the pre-charge phase of the reading operation, while the bit lines BLm, $BLr_1$, $BLr_2$ and $BLr_3$ are pre-charged to the reference voltage $V_{ref}$ the output node 610 can be pre-charged to the start ramp voltage $V_{start}$.

When the logic signal READING is asserted, the selected word line WLm and the reference word line WLr are coupled to the ramp voltage generator 115 by the word line decoder/selector circuits 110r and by the driver 120, respectively, and they are in turn pre-charged to the start ramp voltage $V_{start}$ provided at the output node 610.

When the pre-charge phase finishes and the evaluation phase starts, the logic signal START_RAMP is asserted and the voltage regulator 635 is isolated from the output node 610. Furthermore, the switch 627 is enabled (closed) and the current supplied by the current generator 620 is mirrored on the p-MOS transistor 625 for being exploited by the ramp voltage generator 115.

The ramp voltage generator 115 provides the ramp voltage $V_{ramp}$ starting from the start ramp voltage $V_{start}$ at which the output node 610 is pre-charged, instead of the ground voltage, and during the evaluation phase the word line voltage $V_{WL}$ follows the ramp voltage $V_{ramp}$.

Since the ramp voltage $V_{ramp}$ starts from the start ramp voltage $V_{start}$, instead of the ground voltage, the time required for a reading operation is further reduced in accordance with the request for faster memory devices.

It is pointed out that the lastly described technique for starting the bias voltage ramp at a voltage higher than the ground can also be exploited in the reading circuit of FIG. 4A.

Although the present invention has been disclosed and described by way of embodiments, it is apparent to those skilled in the art that several modifications to the described embodiments, as well as other embodiments of the present invention are possible without departing from the scope thereof as defined in the appended claims.

For example, the memory cells can be programmed at a different number of levels (possibly, only two levels) and storing a different number of bits; the reference cells can be provided within the matrix of memory cells and selected by the decoder/selector circuits instead of the driver and the switches. Other logic signals can be generated in the memory device and involved in the operation thereof. The sense amplifier can have a different structure, in particular other circuital elements can be exploited in place of the resistor and of the differential amplifiers. Also the start ramp logic signal can be generated by exploiting another structure in place of the flip-flop D and the wired-NOR connection can be obtained with a different number and type of transistors. Moreover, the voltage supply circuit can include a different number and type of transistors and the current exploited therein can be provided in a way different from a current-mirror. Other way of combining the signals $OUT_j$ may be possible, like for example a wired OR.

Furthermore, it is pointed out that although described in connection with the voltage ramp reading technique, the present invention is not to be construed as having limited applicability to this particular sensing technique, being in general useful irrespective of the reading technique adopted; in particular, the present invention may also be applicable to the "voltage box" reading technique, wherein a step-like voltage is applied to the word lines of the addressed memory cell and reference cells, and the current sunk by the addressed memory cell is compared to the currents sunk by the reference cells.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A reading circuit for reading semiconductor memory cells, adapted to be coupled to at least one memory cell and to at least one reference cell through a respective bit line, the reading circuit including:
   a pre-charge circuit for pre-charging the bit lines to a predefined voltage during a pre-charge phase of a reading operation on the memory cell;
   a biasing circuit for applying a bias to a respective control terminal of the memory cell and of the reference cell in response to an enabling signal; and
   for each bit line, an evaluation circuit for evaluating an electric quantity developing on the bit line as a consequence of the bias during an evaluation phase of the reading operation on the memory cell, an information content of the memory cell being determined on the basis of the electric quantity that develops on the bit lines,
   wherein the enabling signal is provided by the pre-charge circuit in response to an indication that the bit lines have reached the predefined voltage.

2. The circuit for reading memory cells according to claim 1, wherein the pre-charge circuit includes, for each bit line, a respective bit line circuit for pre-charging the respective bit line to the predefined voltage and for providing a respective pre-charge logic signal indicative of the fact that the bit line has reached the predefined voltage, the indication being provided in accordance with the pre-charge logic signals.

3. The circuit for reading memory cells according to claim 2, wherein the pre-charge circuit further includes a logical combination of the pre-charge logic signals, particularly a wired-NOR combination.

4. The circuit for reading memory cells according to claim 3, wherein said wired-NOR combination includes a switching element having a first terminal coupled to the common node, a second terminal coupled to a reference voltage node and a control terminal receiving the pre-charge logic signal.

5. The circuit for reading memory cells according to claim 1, wherein the pre-charge circuit further includes means for asserting the enabling signal in response to the indication that the bit lines have reached the predefined voltage.

6. The circuit for reading memory cells according to claim 5, wherein the means for asserting include means for latching the enabling signal in response to the indication that the bit lines have reached the predefined voltage.

7. The circuit for reading memory cells according to claim 1, wherein the evaluation circuit is enabled by the enabling signal.

8. The circuit for reading memory cells according to claim 1, wherein said biasing circuit is adapted to apply a bias variable over time in a substantially monotone way, and wherein the evaluation circuit is adapted to determine an information content of the memory cell on the basis of a time relationship between the time instants at which the electric quantity develops on the bit lines.

9. The circuit for reading memory cells according to claim 1, wherein a start value of the bias provided by the biasing circuit is higher than ground.

10. The circuit for reading memory cells according to claim 9, wherein the biasing circuit includes:
   means for pre-charging an output node of the biasing circuit to the start value during a pre-charge phase of the reading operation on the memory cell, and
   a current-mirror structure, enabled by the enabling signal, for supplying the bias varying starting from the start value during the evaluation phase of the reading operation on the memory cell.

11. The circuit for reading memory cells according to claim 10, wherein the biasing circuit further includes a voltage regulator coupled to the output node of the biasing circuit, the voltage regulator for supplying a regulated voltage taking the start value in accordance with a configuration signal in response to the enabling signal deasserted.

12. A semiconductor memory comprising at least one memory cell and a circuit for reading an information content of the memory cell, wherein the circuit for reading is realized according to any one of the claims 1 to 11.

13. A method of reading semiconductor memory cells, including:

coupling at least one memory cell and at least one reference cell to a circuit for reading memory cells through a respective bit line;

pre-charging the bit lines to a predefined voltage during a pre-charge phase of a reading operation on the memory cell;

applying a bias to a control terminal of the memory cell and of the reference cell in response to an enabling signal; and evaluating an electric quantity developing on each bit line as a consequence of the bias during an evaluation phase of the reading operation on the memory cell, an information content of the memory cell being determined on the basis of the electric quantity that develops on the bit lines, wherein pre-charging the bit lines includes providing the enabling signal in response to an indication that the bit lines have reached the predefined voltage.

* * * * *